United States Patent
Hwang

(10) Patent No.: US 7,606,095 B2
(45) Date of Patent: Oct. 20, 2009

(54) SEMICONDUCTOR MEMORY DEVICE HAVING A PRECHARGE VOLTAGE SUPPLY CIRCUIT CAPABLE OF REDUCING LEAKAGE CURRENT BETWEEN A BIT LINE AND A WORD LINE IN A POWER-DOWN MODE

(75) Inventor: Mi Hyun Hwang, Anyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 69 days.

(21) Appl. No.: 12/012,933

(22) Filed: Feb. 5, 2008

(65) Prior Publication Data

US 2009/0109775 A1   Apr. 30, 2009

(30) Foreign Application Priority Data

Oct. 29, 2007   (KR) .................. 10-2007-0109129

(51) Int. Cl.
*G11C 7/12* (2006.01)
*G11C 7/20* (2006.01)

(52) U.S. Cl. .................. 365/203; 365/202; 365/189.09; 365/189.08; 365/229; 365/227

(58) Field of Classification Search ............ 365/189.09, 365/203, 202, 229, 228, 227, 226, 189.08
See application file for complete search history.

(56) References Cited

U.S. PATENT DOCUMENTS

| 7,230,866 B2 * | 6/2007 | Kim ............................ 365/203 |
| 7,474,143 B2 * | 1/2009 | Sato et al. .................... 327/541 |
| 2007/0247938 A1 | 10/2007 | Miller et al. | |
| 2009/0109775 A1 * | 4/2009 | Hwang ........................ 365/203 |

FOREIGN PATENT DOCUMENTS

| KR | 10-2004-0037915 A | 5/2004 |
| KR | 10-2006-0082978 A | 7/2006 |
| KR | 10-0665854 B1 | 1/2007 |

* cited by examiner

*Primary Examiner*—Andrew Q Tran
(74) *Attorney, Agent, or Firm*—John P. White; Cooper & Dunham LLP

(57) ABSTRACT

A precharge voltage supply circuit and a semiconductor memory device using the same are described. The precharge voltage supply circuit includes a first voltage supplier configured to reduce a precharge voltage and supply the reduced precharge voltage in response to a power down mode signal that is activated in a power down mode, a second voltage supplier configured to supply a power voltage in a predetermined section from a point of time when exiting the power down mode, and a third voltage supplier configured to supply the precharge voltage after a lapse of the predetermined section.

23 Claims, 4 Drawing Sheets

SEMICONDUCTOR MEMORY DEVICE HAVING A PRECHARGE VOLTAGE SUPPLY CIRCUIT CAPABLE OF REDUCING LEAKAGE CURRENT BETWEEN A BIT LINE AND A WORD LINE IN A POWER-DOWN MODE

BACKGROUND

The present disclosure relates to a semiconductor memory device, and more particularly, to a precharge voltage supply circuit, which is capable of reducing the amount of leakage current leaked through a bridge formed between a bit line and a word line in a power down mode and rapidly recovering a bit line precharge voltage level when exiting the power down mode.

As semiconductor devices are being highly integrated in recent years, an occupation area of each component in semiconductor devices is gradually decreasing. Particularly, in the case of dynamic random access memories (DRAMs), the likelihood that a bridge phenomenon may occur between a word line and a bit line is increasing due to a reduction in a gate pitch. The bridge phenomenon between the word line and the bit line is mainly attributed to a gate residue that remains between the word line and the bit line, i.e., a polysilicon layer is not completely etched away during an etch process to form a gate, or attributed to a portion of a nitride layer disposed over the gate that is undesirably removed during a chemical mechanical polishing (CMP) process and thus that portion has a weakness.

FIG. 1 illustrates a word line and a bit line in a semiconductor memory device. If the bridge is formed between the word line and the bit line illustrated in FIG. 1, the bridge serves as a current path therebetween. Accordingly, charges accumulated in the bit line flow through the current path in a standby mode of the semiconductor memory device, thus generating undesirable leakage current between the word line and the bit line in the standby mode. Of course, it may be possible to prevent erroneous operations caused by formation of a bridge by substituting the failed cell, in which the bridge is formed, with a redundant cell. In this case, however, the failed cell still remains in the semiconductor device. This makes the leakage current keep on flowing into the failed cells.

In real products, for example, 32M pseudo static RAMs (SRAMs), a leakage current flows through a bridge with the magnitude of approximately 9 μA per one "R+C". If, however, the magnitude of leakage current becomes great like above, product yield may be reduced by about 40%.

Therefore, there is a limitation in reducing the leakage current flowing through the bridge using a voltage drop transistor and a bleeder resistor because the bridge formed between the word line and the bit line may have a resistance varied with a failure type of a gate pattern.

SUMMARY

Various embodiments of the present disclosure, infra, are directed to a precharge voltage supply circuit, which is capable of reducing the amount of leakage current leaked through a bridge between a bit line and a word line in a power down mode, and rapidly recovering a bit line precharge voltage level when exiting the power down mode.

In an aspect of the present disclosure, a precharge voltage supply circuit includes a first voltage supplier configured to reduce a precharge voltage to supply the reduced precharge voltage in response to a power down mode signal that is activated in a power down mode, a second voltage supplier configured to supply a power voltage in a predetermined section from a point of time when exiting the power down mode, and a third voltage supplier configured to supply the precharge voltage after a lapse of the predetermined section.

The first voltage supplier may include a switch configured to be connected between a precharge voltage supply terminal and a first node, and to supply the precharge voltage to the first node in response to the power down mode signal, and a resistor configured to be connected between the first node and a second node.

The switch may be turned on in the power down mode.

The second voltage supplier may include a logic unit configured to generate a power down mode exit signal that is activated in a predetermined section from a point of time when exiting the power down mode, and a switch configured to be connected between a power voltage supply terminal and a second node, and to supply the power voltage to the second node.

The logic unit may include an inverter configured to invert the power down mode signal, and a logic component configured to perform a logic operation on the power down mode signal and an output signal of the inverter and generate the power down mode exit signal.

The switch may be turned on in a section when the power down mode exit signal is activated.

The third voltage supplier may include a logic component configured to perform a logic operation on the power down mode signal and a power down mode exit signal that is activated in a predetermined section from a point of time when exiting the power down mode, and a switch configured to be connected between a precharge voltage supply terminal and a second node, and to supply the precharge voltage to the second node in response to an output signal of the logic component.

The logic component may perform a NOR operation.

The switch may be turned on before entering the power down mode, or after a lapse of the predetermined section.

In another embodiment, a semiconductor memory device includes a precharge voltage supply circuit configured to supply a first voltage having a first level in a power down mode, supply a second voltage having a second level in a predetermined section from a point of time when exiting the power down mode, and supply a third voltage having a third level after a lapse of the predetermined section, and a precharge circuit configured to precharge a bit line and a complementary bit line with a voltage supplied from the precharge voltage supply circuit in response to an enable signal.

The precharge voltage supply circuit may include a first voltage supplier configured to reduce a precharge voltage and supply the reduced precharge voltage as the first voltage having the first level in response to a power down mode signal that is activated in the power down mode, a second voltage supplier configured to supply a power voltage as the second voltage having the second level in a predetermined section from a point of time when exiting the power down mode, and a third voltage supplier configured to supply the precharge voltage as the third voltage having the third level after a lapse of the predetermined section.

DESCRIPTION OF EXEMPLARY EMBODIMENTS

Hereinafter, a precharge voltage supply circuit and a semiconductor memory device using the same in accordance with the present invention will be described in detail with reference to the accompanying drawings.

Figure 1:
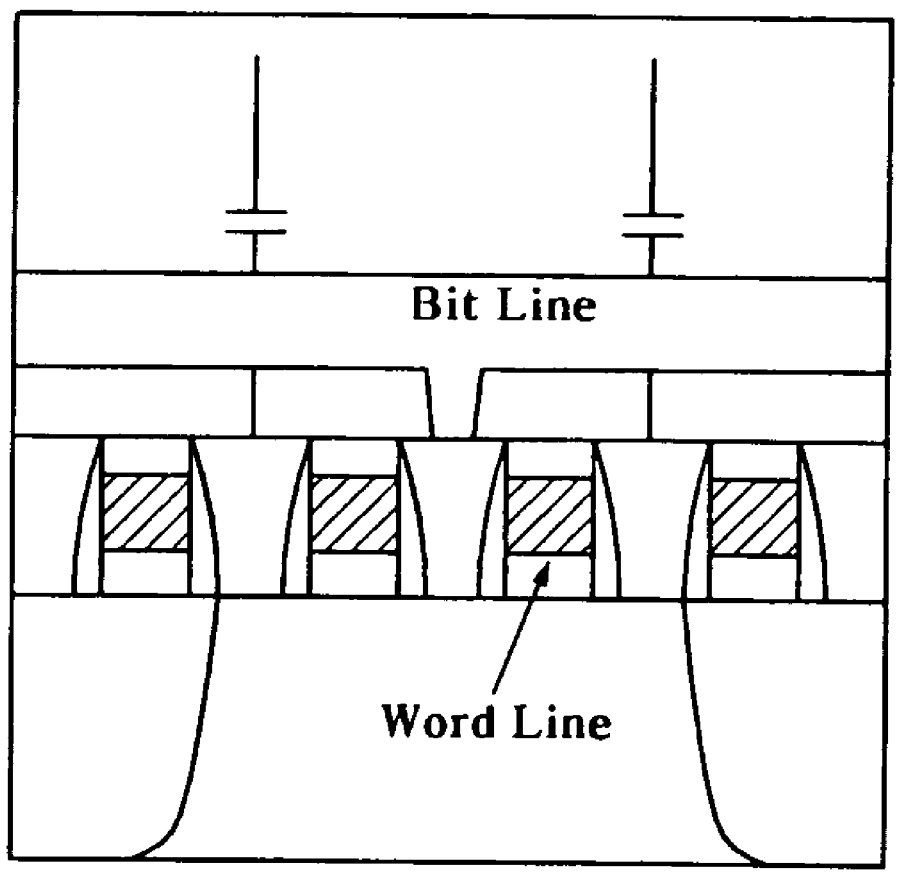
FIG. 1 illustrates a word line and a bit line in a semiconductor memory device.
Figure 2:
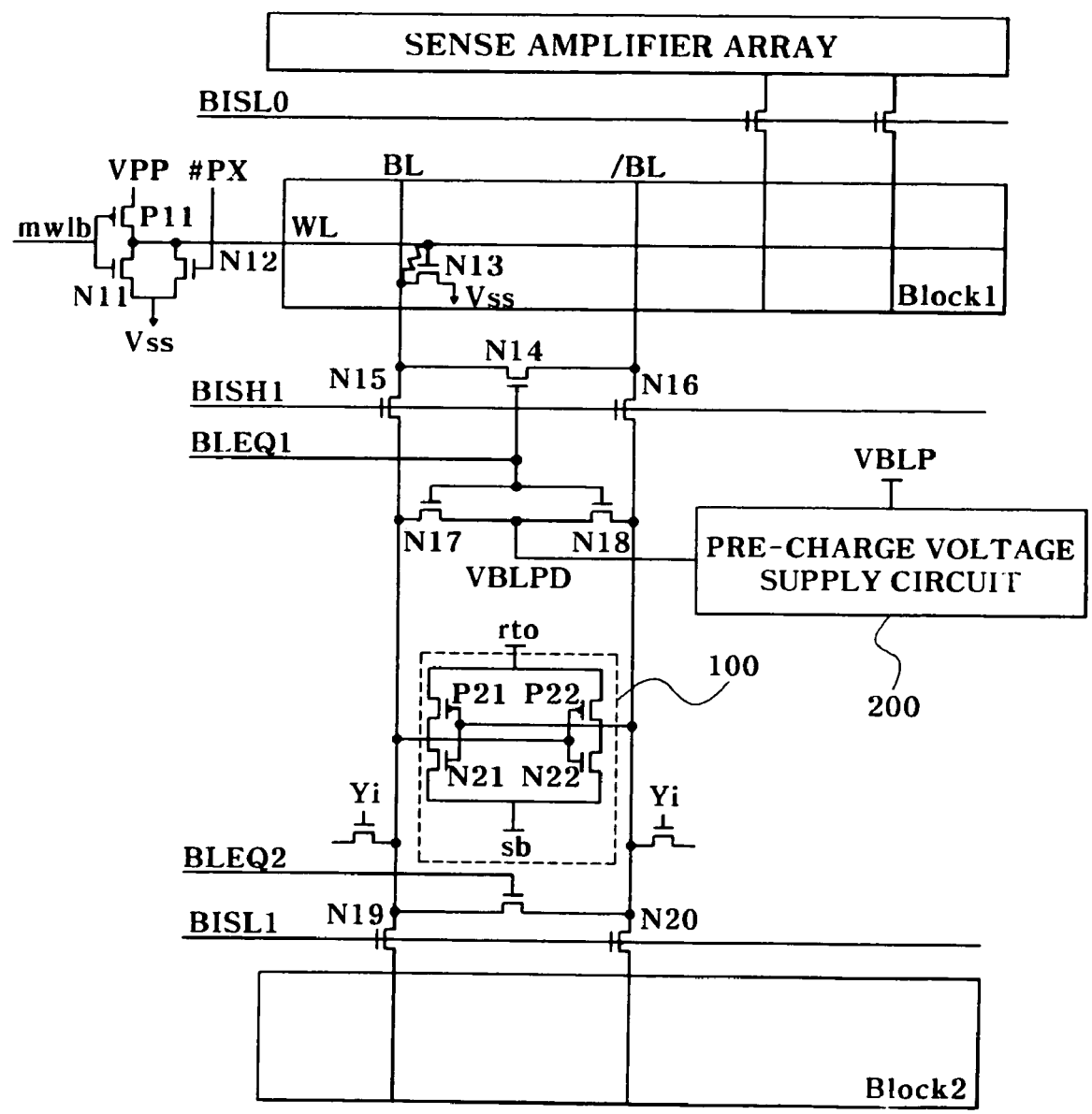
FIG. 2 illustrates a block diagram of a configuration of a memory cell region in a semiconductor memory device according to an exemplary embodiment of the present disclosure.
Figure 3:
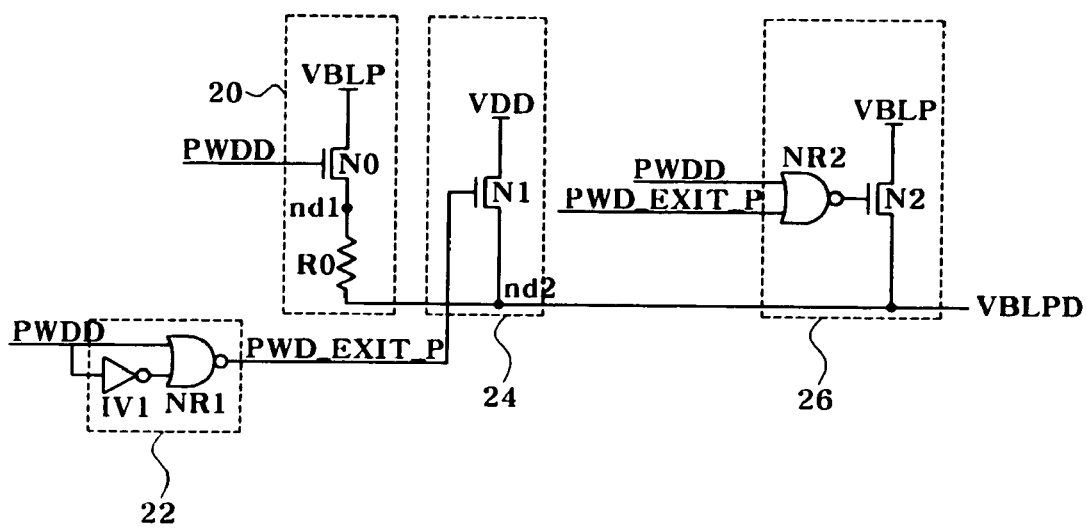
FIG. 3 illustrates a circuit diagram of a precharge supply circuit according to an exemplary embodiment of the present disclosure.

FIG. 2 illustrates a block diagram of a configuration of a memory cell region in a semiconductor memory device according to an exemplary embodiment of the present disclosure. FIG. 3 illustrates a circuit diagram of a precharge supply circuit 200 according to an exemplary embodiment of the present disclosure.

Referring to FIGS. 2 and 3, the precharge voltage supply circuit 200 includes a first voltage supplier 20, a logic unit 22, a second voltage supplier 24 and a third voltage supplier 26.

The first voltage supplier 20 includes a NMOS transistor N0 and a resistor R0. The NMOS transistor N0 supplies a first bit line precharge voltage VBLP to a node nd1 in response to a power down mode signal PWDD that is activated in a power down mode. The resistor R0 is connected between the node nd1 and another node nd2.

The logic unit 22 includes an inverter IV1 configured to invert the power down mode signal PWDD, and a NOR gate NR1 configured to perform a NOR operation on the power down mode signal PWDD and an output signal of the inverter IV1. The logic unit 22 receives the power down mode signal PWDD and generates a power down mode exit signal PWD_EXIT_P.

The second voltage supplier 24 a NMOS transistor N1 supplies an external voltage VDD to the node nd2 in response to the power down mode exit signal PWD_EXIT_P.

The third voltage supplier 26 includes a NOR gate NR2 performs a NOR operation on the power down mode signal PWDD and the power down mode exit signal PWD_EXIT_P, and a NMOS transistor N2 supplies the first bit line precharge voltage VBLP to the node nd2 in response to an output signal of the NOR gate NR2.

Herein, it is preferable that the resistance of the resistor R0 is considerably higher than a turn-on resistance of each of the NMOS transistors N0, N1 and N2.

In the embodiment, the first bit line precharge voltage VBLP is generated through a typical bit line precharge voltage generation circuit, and it is preferable that the first bit line precharge voltage VBLP is not reduced through a transistor or a bleeder resistor. Further, in the embodiment, a second bit line precharge voltage VBLPD output through the node nd2 has different voltage levels before and after entering the power down mode.

As illustrated in FIG. 2, the second bit line precharge voltage VBLPD generated from the precharge voltage supply circuit 200 is supplied to a bit line BL and a complementary bit line/BL through NMOS transistors N17 and N18 which are turned on in a precharge mode and a standby mode, respectively.

Hereinafter, an operation of the precharge voltage supply circuit 200 having the above-described configuration according to the exemplary embodiment of FIGS. 2 and 3 will be described in detail for each operation mode with reference to FIGS. 2 to 5. The operation mode of the semiconductor memory device may be mainly divided into an active mode, a precharge mode and a standby mode. Herein, the active mode means an operation mode in which active operations such as data input and output operations are performed in the semiconductor memory device. The precharge mode means an operation mode in which the bit line and the complementary bit line are precharged to a predetermined voltage having a half level of a core voltage VCORE after the active mode. The standby mode means an operation mode in which the device is in a standby state to maintain low power consumption. There are various standard specifications for achieving low power consumption in the standby mode, one of which is a power down mode. Specifically, the exemplary embodiment of FIGS. 2 and 3 illustrates that the power down mode is executed in the standby mode, for example.

First, an operation in the active mode will be described below. When the semiconductor memory device enters the active mode, a signal mwlb goes to a logic low level from a logic high level and a signal #PX also goes to a logic low level. Accordingly, a PMOS transistor P11 is turned on but NMOS transistors N11 and N12 are turned off so that a word line WL of a block Block1 is driven with a high voltage VPP. Also, a signal BLEQ1 goes to a logic low level from a logic high level to thereby turn off NMOS transistors N14, N17 and N18 so that the bit line BL and the complementary bit line/BL are isolated from each other.

While NMOS transistors N15 and N16 are turned on because a signal BISH1 maintains its logic high level, NMOS transistors N19 and N20 are turned off because a signal BISL1 goes to a logic low level. Consequently, a sense amplifier 100 may sense and amplify data from an NMOS transistor N13, which is a cell transistor, or may perform an operation of inputting data to the cell transistor N13.

Thereafter, an operation in the pre-charge mode will be described below. When the semiconductor device enters the precharge mode after completion of the active mode, the signal mwlb goes to a logic high level from a logic low level, and the signal #PX also goes to a logic high level from a logic low level. Accordingly, the PMOS transistor P11 is turned off but the NMOS transistors N11 and N12 are turned on. As a result, the word line WL in the block Block1 is driven with a ground voltage VSS. Also, the signal BLEQ1 goes to a logic high level from a logic low level. Consequently, the NMOS transistors N14, N17, and N18 are turned on so that the bit line BL and complementary bit line/BL are precharged with a second bit line precharge voltage VBLPD supplied from the precharge voltage supply circuit 200. In this state, the signal BISH1 maintains its logic high level and the signal BISL1 changes to a logic high level to thereby turn on the NMOS transistors N19 and N20, thus making it possible to normally perform a precharge operation on the bit line BL and complementary bit line/BL.

The operation of the precharge voltage supply circuit 200 in the precharge mode will be more specifically described below. Similar to the assumption above, since the semiconductor memory device does not enter the power down mode in the precharge mode, the power down mode signal PWDD is deactivated to a logic low level, and the power down mode exit signal PWD_EXIT_P output from the logic unit 22 also goes to a logic low level. The power down mode signal PWDD of logic low level turns off the NMOS transistor N0, and the power down mode exit signal PWD_EXIT_P of logic low level turns off the NMOS transistor N1. The NOR gate NR2 then performs a NOR operation on the power down mode signal PWDD of logic low level and the power down mode exit signal PWD_EXIT_P of logic low level to thereby output a signal of logic high level, which turns on the NMOS transistor N2. Therefore, the first bit line precharge voltage VBLP is supplied as the second bit line precharge voltage VBLPD through the NMOS transistor N2 which is turned on.

Next, an operation in the standby mode will be described below. When the semiconductor device enters the standby mode after completion of the precharge mode, the signal mwlb maintains its logic high level and the signal #PX maintains its logic high level. Accordingly, the word line WL is still driven with the ground level VSS. Also, the signal BLEQ1 maintains its logic high level so that the second bit line precharge voltage VBLPD supplied from the precharge voltage supply circuit 200 is continuously supplied to the bit line BL and complementary bit line /BL.

Meanwhile, if the cell including the NMOS transistor N13 is a failed cell where a bridge phenomenon occurs between the word line WL and the bit line BL, a leakage current is leaked from the bit line BL to the word line WL. That is, a current path is formed between the bit line BL precharged with the precharge voltage VBLP and the word line WL driven with the ground level VSS, due to the bridge. As a result, the leakage current flows from the bit line BL to the word line WL.

According to the exemplary embodiment of FIGS. 2 and 3, however, although such leakage current is generated, it is possible to control the generation of leakage current such that the amount of leakage current is minimized. That is, the precharge voltage supply circuit 200 according to the exemplary embodiment of FIGS. 2 and 3 precharges the bit line BL by adjusting a voltage level of the second bit line precharge voltage VBLPD in the power down mode entered from the standby mode, so that the amount of leakage current flowing from the bit line BL to the word line WL can be reduced. Hereinafter, the operation of the precharge voltage supply circuit 200 according to the exemplary embodiment of FIGS. 2 and 3 will be described in detail.

Figure 4:
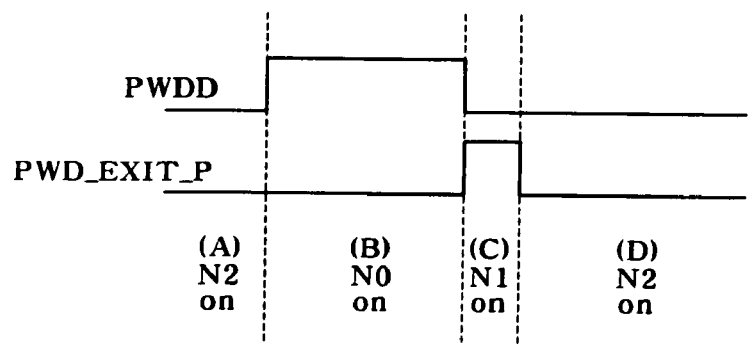
FIG. 4 illustrates a timing diagram of a power down mode signal (PWDD) and a power down mode exit signal (PWD_EXIT_P) shown in FIG. 3.

FIG. 4 illustrates a timing diagram of the power down mode signal PWDD and the power down mode exit signal PWD_EXIT_P.

Referring to FIG. 4, in the section B when the semiconductor memory device enters the power down mode from the standby mode, the power down mode signal PWDD goes to a logic high level and the power down mode exit signal PWD_EXIT_P goes to a logic low level. Accordingly, the NMOS transistor N0 is turned on in response to the power down mode signal PWDD of logic high level, and the NMOS transistor N1 is turned off in response to the power down mode exit signal PWD_EXIT_P of logic low level. Also, the NOR gate NR2 outputs a signal of logic low level to thereby turn off the NMOS transistor N2. As a result, the precharge voltage supply circuit 200 supplies the second bit line precharge voltage VBLPD which is obtained by reducing the first bit line precharge voltage VBLP through a voltage drop across the resistor R0 having high resistance. As mentioned above, the precharge voltage supply circuit 200 according to the exemplary embodiment of FIGS. 2 and 3 can reduce the amount of leakage current flowing from the bit line BL to the word line WL during the power down mode by reducing the voltage level of the second bit line precharge voltage VBLPD used for precharging the bit line. This reduction in leakage current leads to an increase in product yield.

Thereafter, in the section C when the semiconductor memory device exits the power down mode, the power down mode signal PWDD goes to a logic low level to turn off the NMOS transistor N0. The NOR gate NR1 receives the power down mode signal PWDD of logic low level to thereby generate the power down mode exit signal PWD_EXIT_P which is activated to a logic high level in a delay section of the inverter IV1. Here, the section when the power down mode exit signal PWD_EXIT_P maintains its logic high level can be controlled by adjusting a size of a MOS transistor serving as the inverter IV1 or using an inverter chain configured with a plurality of inverters instead of the inverter IV1. The NMOS transistor N2 is turned off but only the NMOS transistor N1 is turned on in response to the power down mode exit signal PWD_EXIT_P of logic high level, so that an external voltage VDD of which a voltage level is higher than that of the first bit line precharge voltage VBLP is supplied as the second bit line precharge voltage VBLPD through the NMOS transistor N1 turned on. In this way, in a predetermined section after completion of the power down mode, the precharge voltage supply circuit 200 according to the exemplary embodiment of FIGS. 2 and 3 supplies the external voltage VDD of high level as the second bit line precharge voltage VBLPD, thus rapidly recovering a level of the bit line precharge voltage. Consequently, it is possible to prevent precharge characteristics from being degraded.

In the section D when the delay section of the inverter IV1 has elapsed after completion of the power down mode, the NMOS transistors N0 and N1 are turned off but the NMOS transistor N2 is turned on because the power down mode signal PWDD goes to a logic low level and the power down mode exit signal PWD_EXIT_P goes to a logic low level from a logic high level. As a result, the first bit line precharge voltage VBLP is supplied as the second bit line precharge voltage VBLPD through the NMOS transistor N2 turned on.

The precharge voltage supply circuit 200 according to the exemplary embodiment of FIGS. 2 and 3 reduces the amount of leakage current flowing from the bit line BL to the word line WL by reducing a level of the second bit line precharge voltage VBLPD supplied to the bit line BL when the semiconductor memory device enters the power down mode from the standby mode, as illustrated in FIG. 4. Further, when the semiconductor memory device exits the power down mode, the second bit line precharge voltage VBLPD supplied to the bit line is driven with the external voltage VDD of high level, thus recovering the level of the precharge voltage rapidly and improving precharge characteristics.

Figure 5:
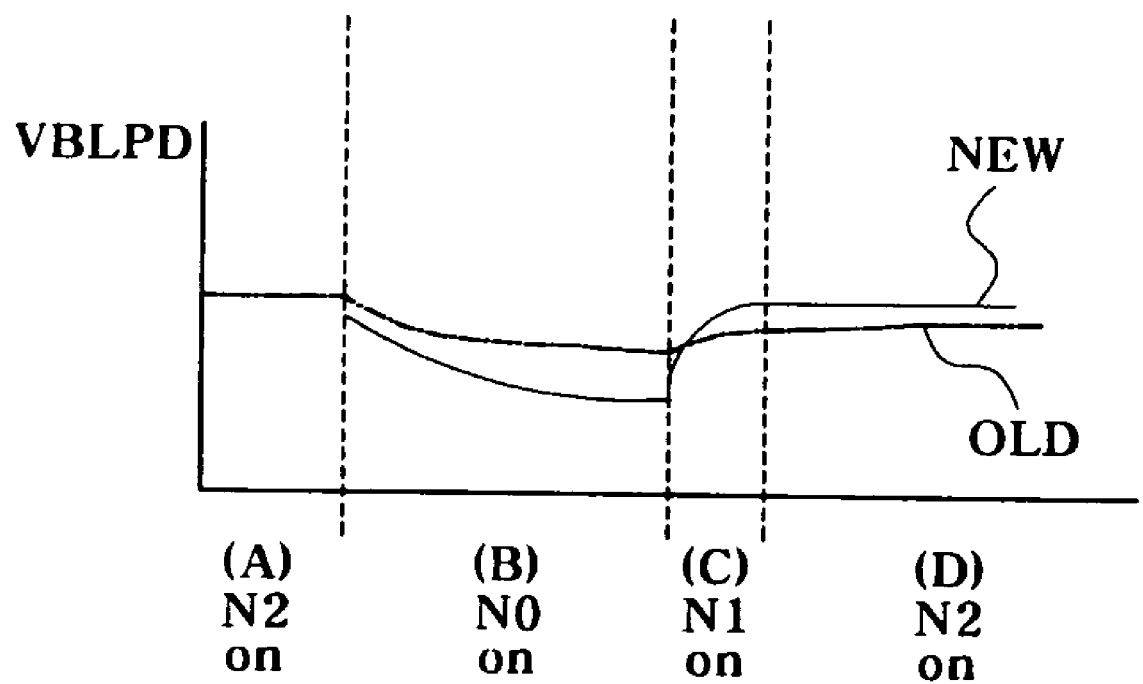
FIG. 5 illustrates a graph comparing a waveform of a bit line precharge voltage supplied by a conventional precharge voltage supply circuit with that of a bit line precharge voltage supplied by the precharge voltage supply circuit of FIG. 3.

FIG. 5 illustrates a graph comparing a waveform of a bit line precharge voltage supplied by a conventional precharge voltage supply circuit with that of a bit line precharge voltage supplied by the precharge voltage supply circuit of FIG. 3.

Referring to FIG. 5, it can be observed that a level NEW of the second bit line precharge voltage VBLPD supplied by the precharge voltage supply circuit 200 according to the exemplary embodiment of FIGS. 2 and 3 is lower in the power down mode B but higher in the sections C and D after exiting the power down mode than a level OLD of a bit line precharge voltage supplied by the conventional precharge voltage supply circuit.

While the present invention has been described with respect to examples and exemplary embodiments, it will be apparent to those skilled in the art that various changes and modifications may be made without departing from the spirit and scope of the disclosure and the following claims.

The present disclosure claims priority to Korean patent application number 10-2007-0109129, filed on Oct. 29, 2007, the entire contents of which are incorporated herein by reference.

What is claimed is:

1. A precharge voltage supply circuit, comprising:
   a first voltage supplier configured to reduce a precharge voltage and supply the reduced precharge voltage in response to a power down mode signal that is activated in a power down mode;
   a second voltage supplier configured to supply a power voltage in a predetermined section from a point of time when exiting the power down mode; and
   a third voltage supplier configured to supply the precharge voltage after a lapse of the predetermined section.

2. The precharge voltage supply circuit of claim 1, wherein the first voltage supplier comprises:
   a switch configured to be connected between a precharge voltage supply terminal and a first node, and to supply the precharge voltage to the first node in response to the power down mode signal; and
   a resistor configured to be connected between the first node and a second node.

3. The precharge voltage supply circuit of claim 2, wherein the switch is turned on in the power down mode.

4. The precharge voltage supply circuit of claim 1, wherein the second voltage supplier comprises:
   a logic unit configured to generate a power down mode exit signal that is activated in the predetermined section from a point of time when exiting the power down mode; and
   a switch configured to be connected between a power voltage supply terminal and a first node, and to supply the power voltage to the first node.

5. The precharge voltage supply circuit of claim 4, wherein the logic unit comprises:
   an inverter configured to invert the power down mode signal; and
   a logic component configured to perform a logic operation on the power down mode signal and an output signal of the inverter and generate the power down mode exit signal.

6. The precharge voltage supply circuit of claim 4, wherein the switch is turned on in a section when the power down mode exit signal is activated.

7. The precharge voltage supply circuit of claim 1, wherein the third voltage supplier comprises:
   a logic component configured to perform a logic operation on the power down mode signal and a power down mode exit signal that is activated in the predetermined section from a point of time when exiting the power down mode; and
   a switch configured to be connected between a precharge voltage supply terminal and a first node, and to supply the precharge voltage to the first node in response to an output signal of the logic component.

8. The precharge voltage supply circuit of claim 7, wherein the logic component performs a NOR operation.

9. The precharge voltage supply circuit of claim 7, wherein the switch is turned on before entering the power down mode, or after a lapse of the predetermined section.

10. A semiconductor memory device, comprising:
    a precharge voltage supply circuit configured to supply a first voltage having a first level in a power down mode, supply a second voltage having a second level in a predetermined section from a point of time when exiting the power down mode, and supply a third voltage having a third level after a lapse of the predetermined section; and
    a precharge circuit configured to precharge a bit line and a complementary bit line with a voltage supplied from the precharge voltage supply circuit in response to an enable signal.

11. The semiconductor memory device of claim 10, wherein the enable signal is activated in a precharge mode or a standby mode.

12. The semiconductor memory device of claim 10, wherein the precharge voltage supply circuit comprises:
    a first voltage supplier configured to reduce a precharge voltage and supply the reduced precharge voltage as the first voltage having the first level in response to a power down mode signal that is activated in the power down mode;
    a second voltage supplier configured to supply a power voltage as the second voltage having the second level in the predetermined section from a point of time when exiting the power down mode; and
    a third voltage supplier configured to supply the precharge voltage as the third voltage having the third level after a lapse of the predetermined section.

13. The semiconductor memory device of claim 12, wherein the first voltage supplier comprises:
    a switch configured to be connected between a precharge voltage supply terminal and a first node, and to supply the precharge voltage to the first node in response to the power down mode signal; and
    a resistor configured to be connected between the first node and a second node.

14. The semiconductor memory device of claim 13, wherein the switch is turned on in the power down mode.

15. The semiconductor memory device of claim 12, wherein the second voltage supplier comprises:
    a logic unit configured to generate a power down mode exit signal that is activated in the predetermined section from a point of time when exiting the power down mode; and
    a switch configured to be connected between a power voltage supply terminal and a first node, and to supply the power voltage to the first node.

16. The semiconductor memory device of claim 15, wherein the logic unit comprises:
    an inverter configured to invert the power down mode signal; and
    a logic component configured to perform a logic operation on the power down mode signal and an output signal of the inverter and generate the power down mode exit signal.

17. The semiconductor memory device of claim 15, wherein the switch is turned on in a section when the power down mode exit signal is activated.

18. The semiconductor memory device of claim 12, wherein the third voltage supplier comprises:
    a logic component configured to perform a logic operation on the power down mode signal and a power down mode exit signal that is activated in the predetermined section from a point of time when exiting the power down mode; and
    a switch configured to be connected between a precharge voltage supply terminal and a first node, and to supply the precharge voltage to the first node in response to an output signal of the logic component.

19. The semiconductor memory device of claim 18, wherein the switch is turned on before entering the power down mode, or after a lapse of the predetermined section.

20. A semiconductor memory device, comprising:
    a first voltage supplier configured to reduce a precharge voltage and supply the reduced precharge voltage as a first voltage having a first level in response to a power down mode signal that is activated in a power down mode;

a second voltage supplier configured to supply a power voltage as a second voltage having a second level in a predetermined section from a point of time when exiting the power down mode; and a third voltage supplier configured to supply the precharge voltage as a third voltage having a third level after a lapse of the predetermined section; and a precharge unit configured to precharge a bit line and a complementary bit line with voltages supplied from the first through third voltage suppliers in response to an enable signal.

21. The semiconductor memory device of claim 20, wherein the first voltage supplier comprises:

a switch configured to be connected between a precharge voltage supply terminal and a first node, and to supply the precharge voltage to the first node in response to the power down mode signal; and a resistor configured to be connected between the first node and a second node.

22. The semiconductor memory device of claim 20, wherein the second voltage supplier comprises:

a logic unit configured to generate a power down mode exit signal that is activated in the predetermined section from a point of time when exiting the power down mode; and a switch configured to be connected between a power voltage supply terminal and a first node, and to supply the power voltage to the first node.

23. The semiconductor memory device of claim 20, wherein the third voltage supplier comprises:

a logic component configured to perform a logic operation on the power down mode signal and a power down mode exit signal that is activated in the predetermined section from a point of time when exiting the power down mode; and a switch configured to be connected between a precharge voltage supply terminal and a first node, and to supply the precharge voltage to the first node in response to an output signal of the logic component.

\* \* \* \* \*